US012701731B2

(12) United States Patent
Chang et al.

(10) Patent No.: US 12,701,731 B2
(45) Date of Patent: Aug. 4, 2026

(54) CARRIER STRUCTURE FOR ETCH-BACK SILICON-ON-INSULATOR PROCESS

(71) Applicant: Taiwan Semiconductor Manufacturing Company, Ltd., Hsinchu (TW)

(72) Inventors: Hung-Chang Chang, Tainan City (TW); Chia-Shiung Tsai, Hsin-Chu (TW); Eugene Chen, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 503 days.

(21) Appl. No.: 18/303,148

(22) Filed: Apr. 19, 2023

(65) Prior Publication Data

US 2024/0355902 A1 Oct. 24, 2024

(51) Int. Cl.
H10D 30/01 (2025.01)
H10D 30/47 (2025.01)
H10D 62/85 (2025.01)

(52) U.S. Cl.
CPC ......... H10D 30/015 (2025.01); H10D 30/475 (2025.01); H10D 62/8503 (2025.01)

(58) Field of Classification Search
CPC .... H10D 30/015; H10D 30/75; H10D 30/475; H10D 62/8503
See application file for complete search history.

(56) References Cited

U.S. PATENT DOCUMENTS

| | | | | |
|---|---|---|---|---|
| 11,264,469 | B2 * | 3/2022 | Wu | H10D 64/118 |
| 2020/0006271 | A1 * | 1/2020 | Chen | H01S 5/18361 |
| 2022/0181450 | A1 * | 6/2022 | Lee | H10D 62/8503 |

* cited by examiner

*Primary Examiner* — William B Partridge
*Assistant Examiner* — Chevy J Boegel
(74) *Attorney, Agent, or Firm* — Harrity & Harrity, LLP

(57) ABSTRACT

Some implementations herein describe a carrier structure and techniques of forming a semiconductor device using the carrier structure. The carrier structure includes a core layer formed from a layer of a high bandgap material, a backside layer stack formed on a backside surface of the layer of the high bandgap material, and a frontside layer stack formed on a frontside surface of the layer of the high bandgap material. The backside layer stack includes a backside chucking layer (e.g., a layer of a polysilicon material) that intervenes between a backside diffusion barrier layer and a backside adhesion layer. The frontside layer stack includes a corresponding frontside diffusion barrier layer that interfaces directly with a corresponding frontside adhesion layer. A corresponding frontside chucking layer has been eliminated. By eliminating the frontside chucking layer, a likelihood of thermally-induced stresses and/or strains due to a coefficient of thermal expansion mismatch between layers of the frontside layer stack and other layers of the semiconductor device, during formation of the semiconductor device, is reduced.

20 Claims, 16 Drawing Sheets

2A00

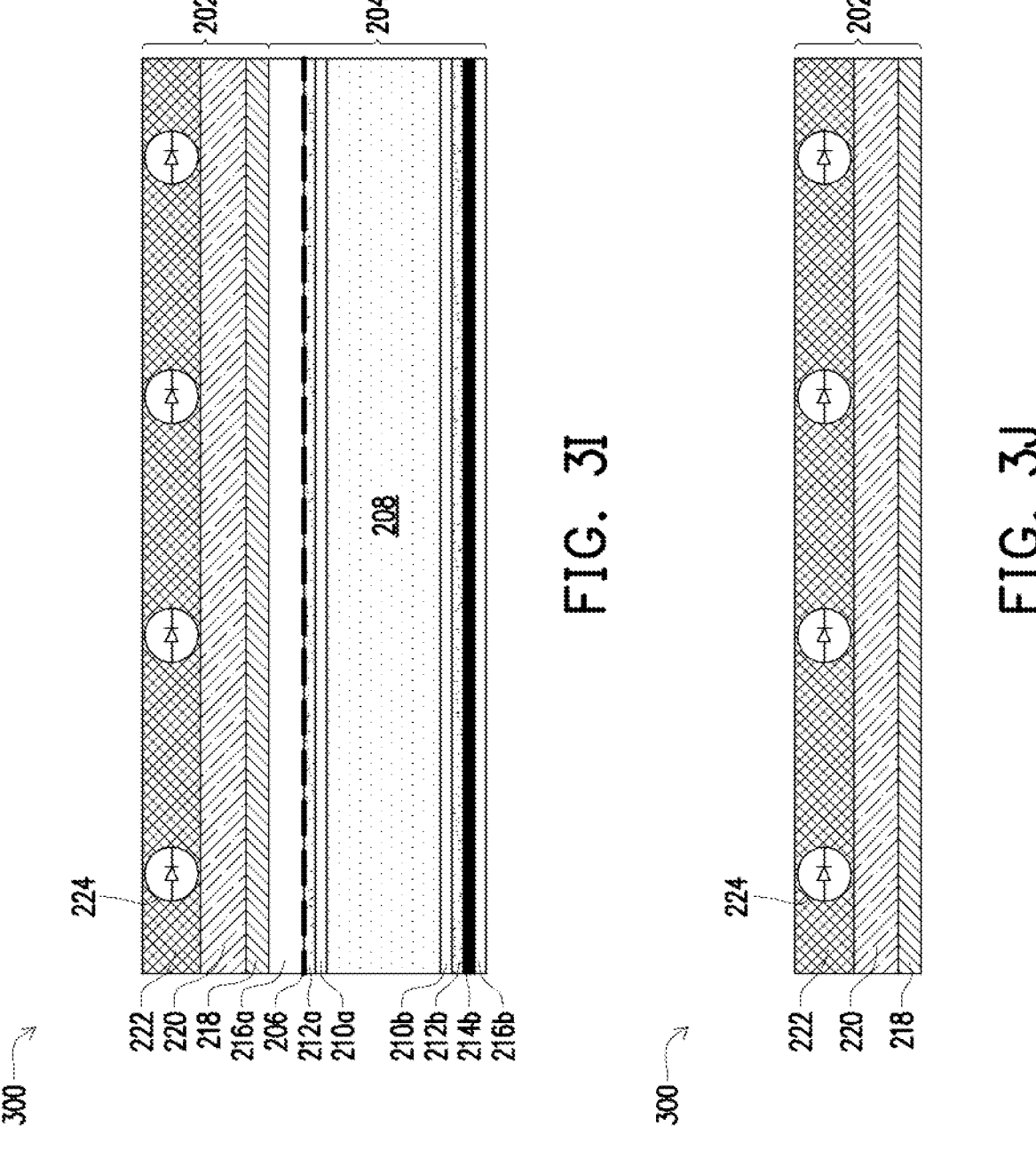

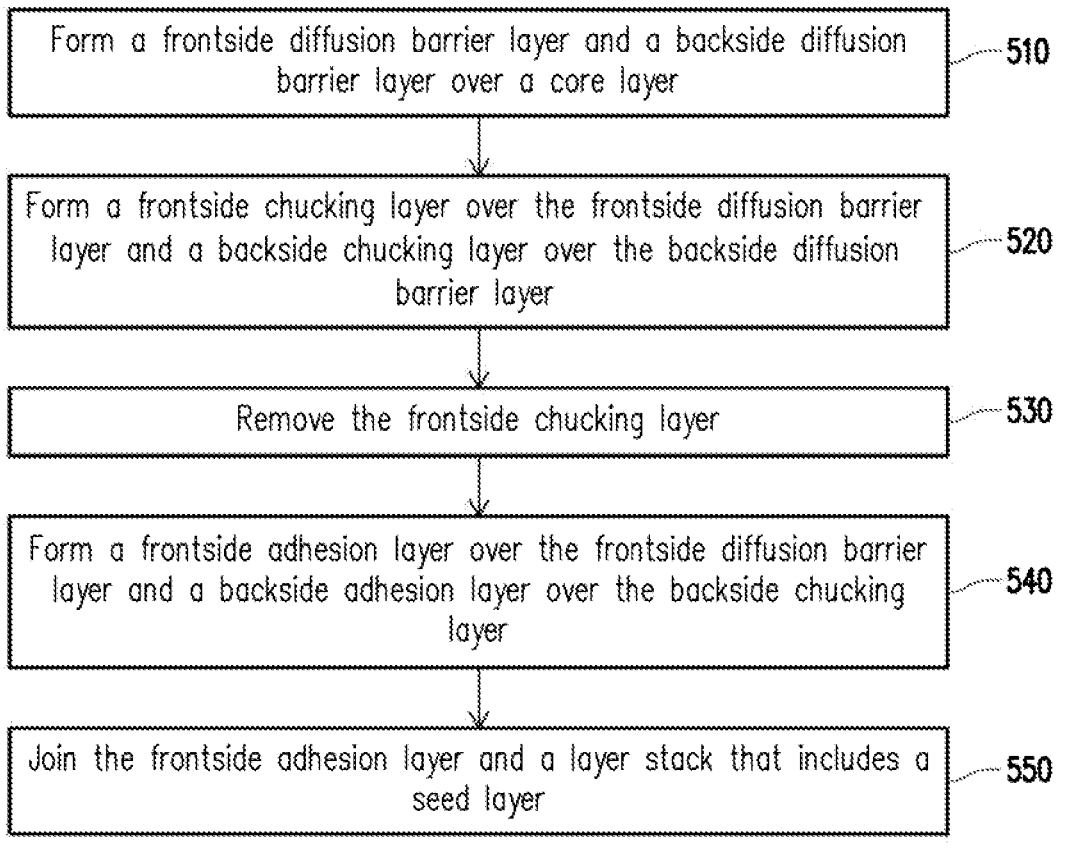

500

Form a frontside diffusion barrier layer and a backside diffusion barrier layer over a core layer ~~~ 510

Form a frontside chucking layer over the frontside diffusion barrier layer and a backside chucking layer over the backside diffusion barrier layer ~~~ 520

Remove the frontside chucking layer ~~~ 530

Form a frontside adhesion layer over the frontside diffusion barrier layer and a backside adhesion layer over the backside chucking layer ~~~ 540

Join the frontside adhesion layer and a layer stack that includes a seed layer ~~~ 550

| | |
|---|---|
| Form a core layer | 610 |
| Form a first adhesion layer over the core layer | 620 |
| Form a diffusion barrier layer over the first adhesion layer | 630 |
| Form a second adhesion layer over the diffusion barrier layer | 640 |
| Join the second adhesion layer with a layer stack that includes a substrate layer that is over a seed layer | 650 |

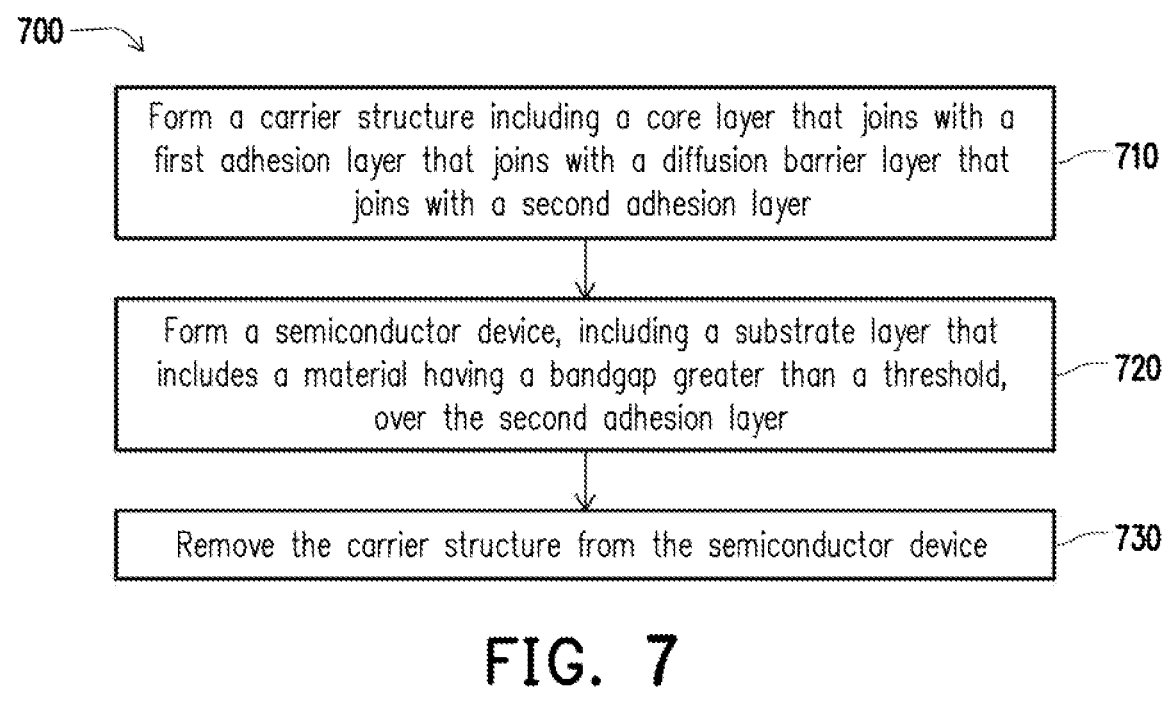

700

Form a carrier structure including a core layer that joins with a first adhesion layer that joins with a diffusion barrier layer that joins with a second adhesion layer — 710

Form a semiconductor device, including a substrate layer that includes a material having a bandgap greater than a threshold, over the second adhesion layer — 720

Remove the carrier structure from the semiconductor device — 730

FIG. 7

CARRIER STRUCTURE FOR ETCH-BACK SILICON-ON-INSULATOR PROCESS

BACKGROUND

Gallium nitride (GaN)-based materials have several advantages on electrical, mechanical, and chemical properties, such as wide band gap, high breakdown voltage, high electron mobility, large elastic modulus, high piezoelectric and piezoresistive coefficients, etc., as well as chemical inertness. Such advantages make GaN-based materials attractive for making semiconductor devices such as power management devices, high brightness light-emitting diodes (LEDs), and other types of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3J are diagrams of an example series of operations using a carrier structure including an interface region described herein.

FIGS. 5-7 are flowcharts of an example process associated with forming the carrier structure including the interface region described herein.

DETAILED DESCRIPTION

Figure 1:
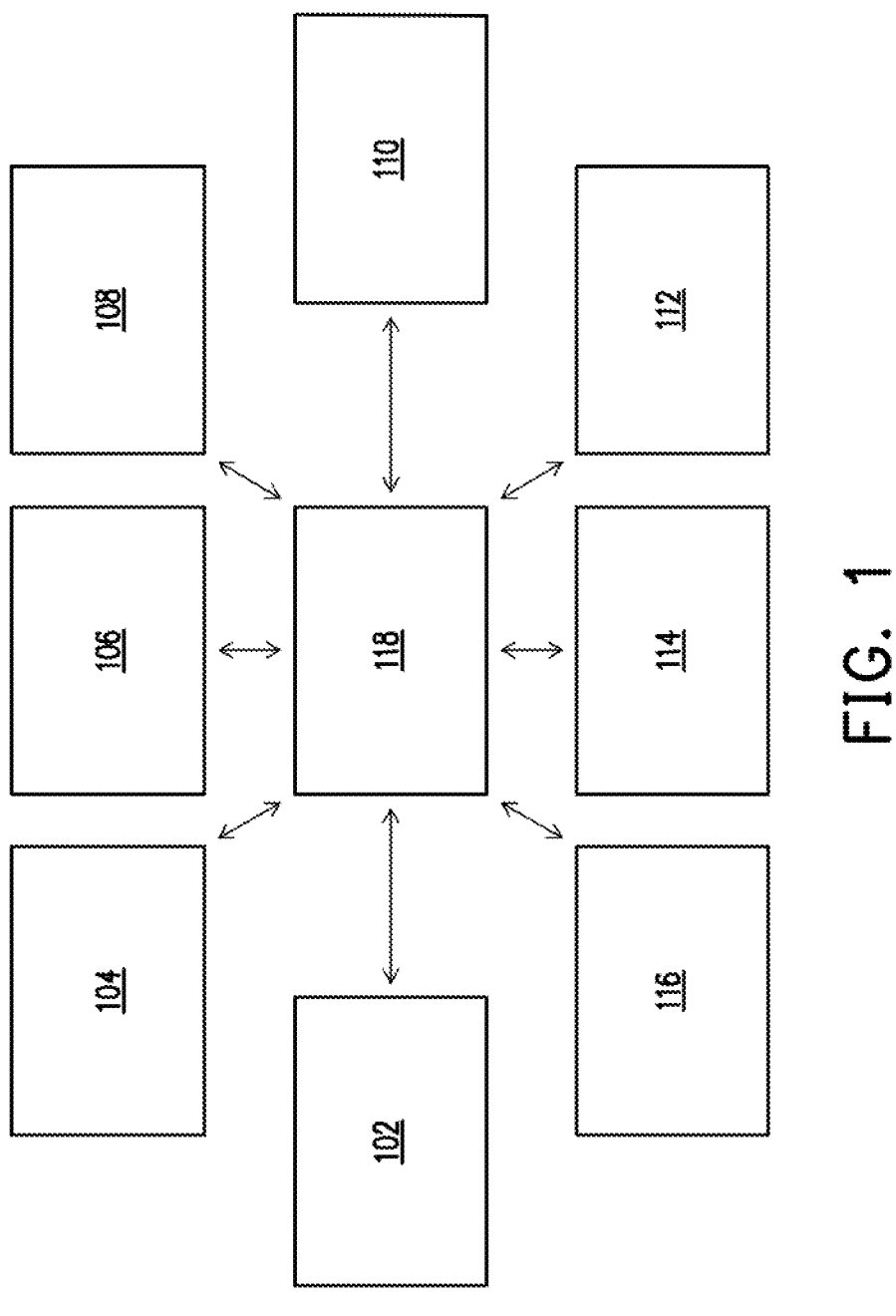
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some contexts, a semiconductor device (e.g., a power device or an optoelectronic device) requires a high operating voltage that may be higher than 600 volts, such as in a range of approximately 600 volts (V) to approximately 1200 volts (V). The semiconductor device may be fabricated using a silicon-on-insulator fabrication process, where a silicon seed layer is formed or bonded to an insulator structure (e.g., a base wafer, a base substrate, or a carrier structure, sometimes referred to as a "handle" substrate). The semiconductor device may be fabricated on the silicon seed layer.

Techniques to fabricate the insulator structure may include using dual-sided deposition processes to form a frontside layer stack on a front surface of a high bandgap core material and a backside layer stack on a backside surface of the high bandgap core material. Both the frontside layer stack and the backside layer stack may include a "chucking layer" made of a material that may be polarized by an electrostatic chuck (e.g., polysilicon) for attracting/ securing purposes. The chucking layer in the backside layer stack is needed for use with the electrostatic chuck. The chucking layer in the frontside layer stack is a biproduct of the dual-sided deposition process and is unneeded. Furthermore, the presence of the chucking layer in the frontside layer stack may induce coefficient of thermal expansion (CTE) mismatches during formation of the semiconductor device on the carrier structure.

Some implementations herein describe a carrier structure and techniques of forming a semiconductor device using the carrier structure. The carrier structure includes a core layer formed from a layer of a high bandgap material, a backside layer stack formed on a backside surface of the layer of the high bandgap material, and a frontside layer stack formed on a frontside surface of the layer of the high bandgap material. The backside layer stack includes a backside chucking layer (e.g., a layer of a polysilicon material) that intervenes between a backside diffusion barrier layer and a backside adhesion layer. The frontside layer stack includes a corresponding frontside diffusion barrier layer that interfaces directly with a corresponding frontside adhesion layer. A corresponding frontside chucking layer has been eliminated. By eliminating the frontside chucking layer, a likelihood of thermally-induced stresses and/or strains due to a CTE mismatch between layers of the frontside layer stack and other layers of the semiconductor device, during formation of the semiconductor device, is reduced.

In this way, a yield of a volume of the semiconductor device fabricated using the carrier structure is increased relative to a yield of a volume of the semiconductor device fabricated using another carrier structure that includes the frontside chucking layer. By increasing the yield, an amount of resources required to fabricate an amount of the semiconductor device (e.g., manufacturing tools, raw materials, manpower, and/or computing resources) may be reduced.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a laser tool 114, a bonding tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The laser tool 114 is a semiconductor processing tool that is capable of providing energy to a substrate and/or a semiconductor device. For example, the laser tool 114 may emit electromagnetic radiation (e.g., light) of different wavelengths as part of a heating, cutting, drilling, or lithography operation performed upon substrate and/or the semiconductor device. For a material included as part of substrate and/or the semiconductor device, an amount of energy from the laser source that is absorbed by the material, or that is transmitted through the material, may be dependent on one or more properties of the material (e.g., a lattice structure) and/or a wavelength of the electromagnetic radiation.

The bonding tool 116 is a semiconductor processing tool that is capable of bonding two or more wafers (or two or more semiconductor substrates, or two or more semiconductor devices) together. For example, the bonding tool 116 may include a eutectic bonding tool that is capable of forming a eutectic bond between two or more wafers together. For example, the bonding tool may heat the two or more wafers to form a eutectic system between the materials of the two or more wafers. As another example, the bonding tool 116 may include a hybrid bonding tool, a direct bonding tool, and/or another type of bonding tool. In some implementations, the bonding tool 116 is capable of bonding two or more carrier structures (e.g., two or more carrier structures) together.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform a series of operations described herein. The series of operations includes forming a frontside diffusion barrier layer and a backside diffusion barrier layer over a core layer. The series of operations includes forming a frontside chucking layer over the frontside diffusion barrier layer and a backside chucking layer over the backside diffusion barrier layer. The series of operations includes removing the frontside chucking layer. The series of operations includes forming a frontside adhesion layer over the frontside diffusion barrier layer and a backside adhesion layer over the backside chucking layer. The series of operations includes joining the frontside adhesion layer and a layer stack that includes a seed layer.

Additionally, or alternatively, the series of operations includes forming a core layer, where the that joins with a first adhesion layer that joins with a diffusion barrier layer that joins with a second adhesion layer, where the second adhesion layer is over the over the diffusion barrier layer, the diffusion barrier layer is over the first adhesion layer, and the first adhesion layer is over the core layer. The series of operations includes forming a semiconductor device, including a substrate layer that includes a high bandgap material, over the second adhesion layer, where the substrate layer that includes the material having the bandgap greater than the threshold is over a seed layer of the semiconductor device, and where the seed layer is over the second adhesion layer. The series of operations includes removing the carrier structure from the semiconductor device.

Additionally, or alternatively, the series operations includes forming a carrier structure including a core layer that joins with a first adhesion layer that joins with a diffusion barrier layer that joins with a second adhesion layer. The series of operations includes forming a semiconductor device, including a substrate layer that includes a high bandgap material, directly on the second adhesion layer, where the substrate layer that includes the high bandgap material is directly on a seed layer of the semiconductor device, and where the seed layer is directly on the second adhesion layer. The series of semiconductor manufacturing operations includes removing the temporary carrier structure from the semiconductor device.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2A:
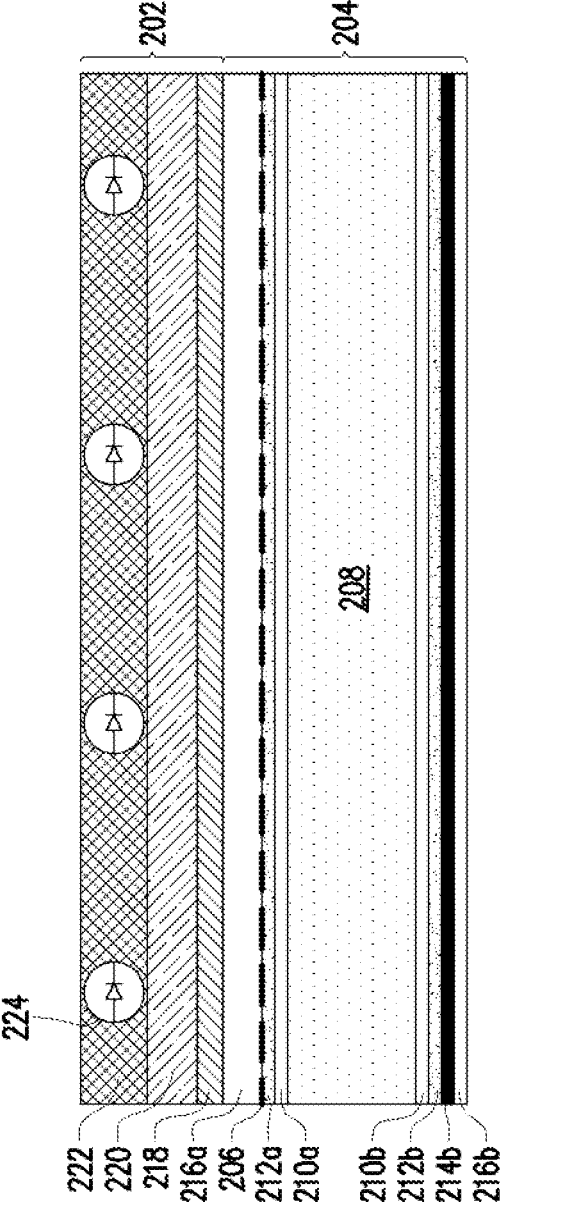
FIGS. 2A and 2B are diagrams of example implementations described herein.
Figure 2B:
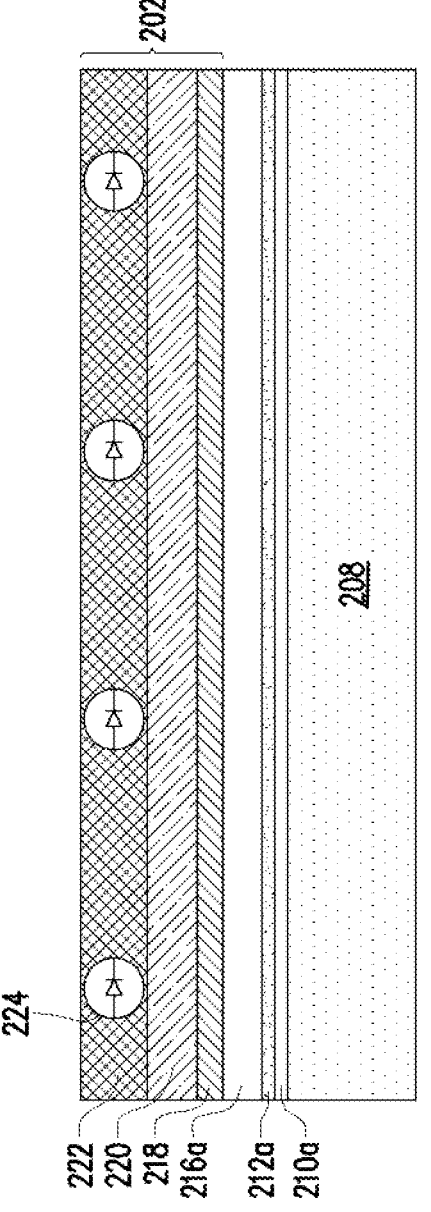

FIGS. 2A and 2B are diagram example implementations 200 described herein. As described in greater detail in connection with FIGS. 3A-3J, and elsewhere herein, a semiconductor device 202 may be formed on a carrier structure 204. During formation of the semiconductor device 202, the carrier structure 204 may include an interface region 206, where frontside layers included in the carrier structure 204 directly interface with one another without an intervening chucking layer.

During formation of the semiconductor device 202, the carrier structure 204 may include a core layer 208 (e.g., a layer of an aluminum nitride (AlN) material). The carrier structure 204 may include a frontside adhesion layer 210a and a corresponding backside adhesion layer 210b (e.g., corresponding layers of dielectric material such as a silicon dioxide ($SiO_2$) material). The carrier structure 204 may include a frontside diffusion barrier layer 212a and a corresponding backside diffusion barrier layer 212b (e.g., corresponding layers of dielectric material such as a silicon nitride (SiN) material). In some implementations, the frontside adhesion layer 210a, the frontside diffusion barrier layer 212a, the backside adhesion layer 210b, and the backside diffusion barrier layer 212b encapsulate the core layer 208 to prevent migration of particulates from the core layer 208 (e.g., AlN particulates) into one or more chambers of the semiconductor processing tools 102-116. By preventing the migration of the particulates, yield losses due to contamination of products fabricated using the semiconductor processing tools 102-116 may be decreased.

As shown in FIG. 2A, the carrier structure 204 includes a backside chucking layer 214b (e.g., a layer of a polysilicon material) that may be used to hold and/or fix the carrier structure 204 in a semiconductor manufacturing tool (e.g., a semiconductor manufacturing tool of the semiconductor manufacturing tools 102-116). For example, in some implementations an electrical bias (e.g., a voltage) is applied to an electrostatic chuck (ESC) of the semiconductor processing tool. Resulting electrical charges within the ESC and the backside chucking layer 214b may generate a coulomb force (e.g., an attractive force) to hold the carrier structure 204 (including one or more portions of the semiconductor device 202) in place and against the ESC as a workpiece.

The carrier structure 204 of FIG. 2A further includes a frontside adhesion layer 216a and a backside adhesion layer 216b (e.g., corresponding layers of dielectric material such as a silicon dioxide (SiO2) material). However, as shown in FIG. 2A, the frontside adhesion layer 216a is over the frontside diffusion barrier layer 212a, and the backside adhesion layer 216b is over the backside chucking layer 214b. In other words, the frontside adhesion layer 216a and the frontside diffusion barrier layer 212a are joined using the interface region 206 (e.g., an interface region without an intervening chucking layer).

The semiconductor device 202 on the carrier structure 204 includes a seed layer 218 (e.g., a layer of a p(−) type of silicon material), a substrate layer 220 including a high bandgap material (e.g., a material having a bandgap greater than silicon or greater than approximately 2.0 electron volts (eV), such as gallium nitride (GaN)), and a high electron mobility transistor (HEMT) structure 222. The HEMT structure 222 may include integrated circuitry 224 (transformer integrated circuitry, amplifier integrated circuitry, voltage regulation integrated circuitry, LED integrated circuitry, and/or photosensor integrated circuitry, among other examples).

Formation of the substrate layer 220, and/or one or more portions of the HEMT structure 222 including the integrated circuitry 224, may include one or more high temperature operations. For example, formation of the substrate layer 220 and one or more portions of the HEMT structure 222 may include a high temperature CVD operation that is performed at a temperature that is within a range of approximately 600 degrees Celsius (° C.) to approximately 800° C.

In such a case, stresses and/or strains within (and damage to) the carrier structure 204 (and/or layers of the semiconductor device 202) may be reduced by matching materials of the substrate layer 220 and the core layer 208 to include a similar coefficient of thermal expansion (CTE). For example, the substrate layer 220 may include a GaN material having a CTE of approximately 6 microns per meter-Kelvin (µm/m·K) for the temperature within the range of approximately 600 degrees Celsius (° C.) to approximately 800° C. In such a case, a material of the core layer 208 may be selected to include an aluminum nitride (AlN) material having an approximately same CTE (e.g., an AlN material having a CTE of approximately 6 µm/m·K for the temperature within the range of approximately 600 degrees ° C. to approximately 800° C.). In such a case, a ratio of the CTE of the substrate layer 220 to a CTE of the core layer 208 may be approximately 1:1.

Additionally, or alternatively, a CTE of a material included in the substrate layer 220 may be included in a range of approximately 5.5 µm/m·K to approximately 6.5 µm/m·K. If the CTE of the material in the substrate layer 220 is less than approximately 5.5 µm/m·K, or greater than approximately 6.5 µm/m·K, a CTE mismatch between an AlN material (and/or a GaN material) included in the core layer 208 and the material included in the substrate layer 220 may occur and cause damage to the semiconductor device 202 during manufacturing of the semiconductor device 202.

Additionally, or alternatively, stresses and/or strains within the carrier structure 204 that are near or local to the semiconductor device 202 may be reduced by reducing layers having CTEs that are mismatched with the substrate layer 220 and that are near the semiconductor device 202. For example, reducing layers may include eliminating a chucking layer including a polysilicon material, where the chucking layer is between the frontside diffusion barrier layer 212a and the frontside adhesion layer 216a. Such a chucking layer may have a CTE of approximately 4 µm/m·K for the temperature within the range of approximately 600 degrees Celsius (° C.) to approximately 800° C. (e.g., the CTE of the chucking layer is different than a CTE of the substrate layer 220 and/or the core layer 208). In such a case, and due to a CTE mismatch with the substrate layer 220 and/or the core layer 208), introduce stresses and/or strains (e.g., cracking defects) to the semiconductor device 202 during manufacturing.

By forming the semiconductor device 202 using the interface region 206 (e.g., the frontside adhesion layer 216a over the frontside diffusion barrier layer 212a without an intervening chucking layer), a manufacturing yield of the semiconductor device 202 may increase relative to another semiconductor device fabricated using techniques that include a chucking layer between the frontside diffusion barrier layer 212a and the frontside adhesion layer 216a. By increasing the manufacturing yield of the semiconductor device 202, an amount of resources to fabricate a volume of the semiconductor device 202 (manufacturing tools, raw materials, manpower, and/or computing resources, among other examples) may be decreased. As described in greater detail in connection with FIGS. 3A-3J, the carrier structure 204 may be a temporary carrier structure and removed from the semiconductor device 202 using a laser removal process.

Alternatively, and as shown in FIG. 2B, portions of the of the carrier structure 204 may be removed (e.g., using a backside thinning operation) and a portion of the core layer 208 may remain connected to the semiconductor device 202. In such a case, a device may include a core layer (e.g., the core layer 208), where the core layer includes a first material (e.g., an AlN material) having a first coefficient of thermal expansion for a temperature range related to a growth of an epitaxial material (e.g., a temperature range related to a growth of a GaN material). The device may include a first adhesion layer (e.g., the frontside adhesion layer 210a) over the core layer, a diffusion barrier layer (e.g., the frontside diffusion barrier layer 212a) over the first adhesion layer, and a second adhesion layer (e.g., the frontside adhesion layer 216a) over the diffusion barrier layer. The device may include a seed layer (e.g., the seed layer 218) over the second adhesion layer and above the diffusion barrier layer. The device may include a substrate layer (e.g., the substrate layer 220) over the seed layer, where the substrate layer includes a second material (e.g., a GaN material) having a second coefficient thermal of expansion for the temperature range related to the growth of the epitaxial material, and where a ratio of the second coefficient of thermal expansion to the first coefficient of thermal expansion is approximately 1:1.

The number and arrangement layers and/or components shown in FIGS. 2A and 2B are provided as one or more examples. In practice, there may be additional layers and/or components, fewer layers and/or components, different layers and/or components, or differently arranged layers and/or components than those shown in FIGS. 2A and 2B.

FIGS. 3A-3J are diagrams of an example series of operations 300 using the carrier structure 204 including the interface region 206 described herein. One or more of the series of operations 300 may be performed by one or more of the semiconductor processing tools 102-116 of FIG. 1. The diagrams include details that may be associated with a portion of the core layer 208). Furthermore, several of the diagrams include a substrate (e.g., wafer) perspective 302, including layers that may be formed on sidewalls of the core layer 208.

Figure 3A:
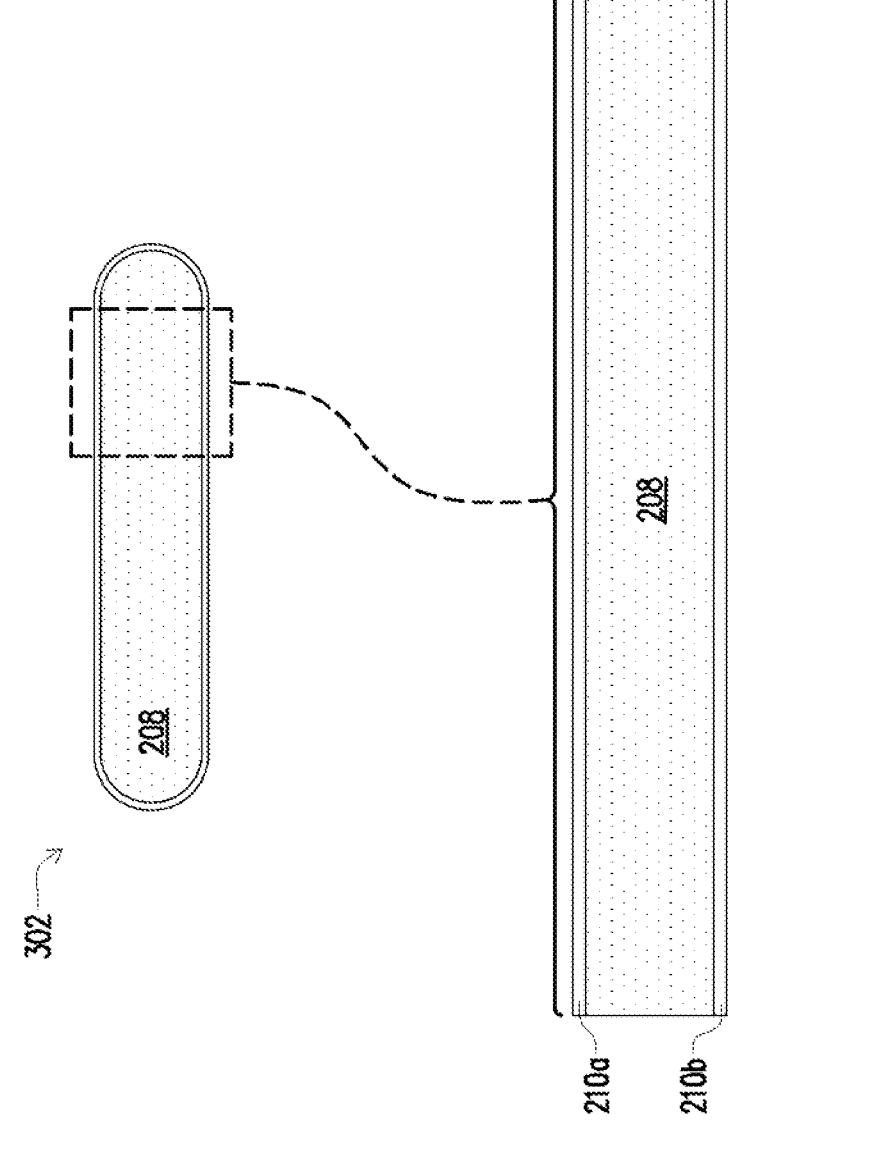

As shown in FIG. 3A, the core layer 208 is formed from a material having a bandgap lattice constant that is included in a range of approximately 6 eV to approximately 6.5 eV. For example, the core layer 208 may include an AlN material. In such a case, forming the core layer 208 may include a hydraulic compression tool (e.g., a hydraulic compression tool external to the environment 100 including the semiconductor processing tools 102-116) compressing an AlN powder. A furnace tool (e.g., a furnace tool external to the environment 100 including the semiconductor processing tools 102-116) may subsequently perform a sintering operation to the compressed AlN powder at an elevated temperature of approximately 2000° C. to form the core layer 208. However, other materials, values, and ranges for a bandgap lattice constant of the material included in the core layer 208, and techniques of forming the core layer 208 are within the scope of the present disclosure.

Figure 3B:
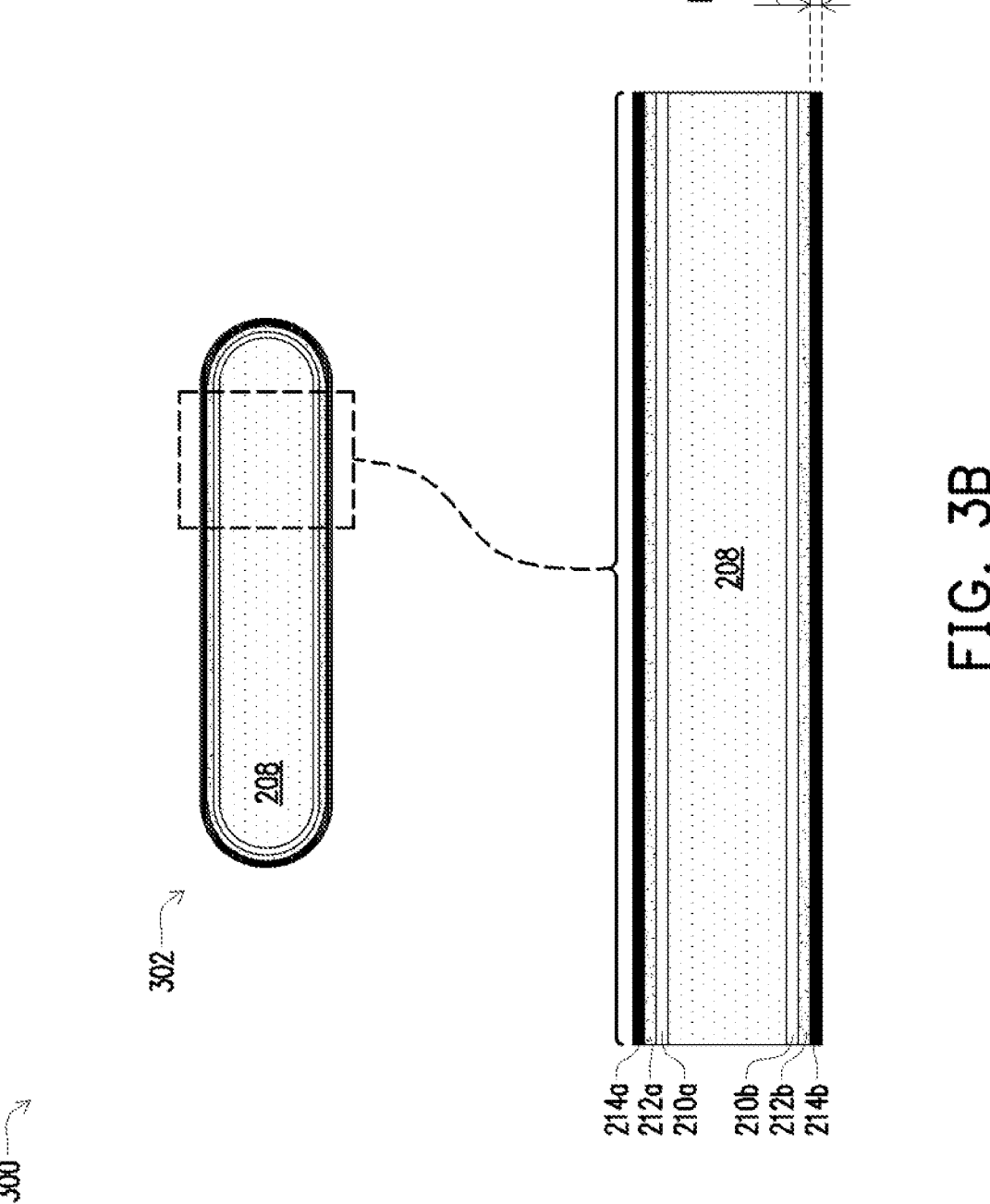

As shown in FIG. 3B, the frontside adhesion layer 210a and the backside adhesion layer 210b may be concurrently formed. The frontside adhesion layer 210a may be formed over and/or on the core layer 208, and the backside adhesion layer 210b may be formed under and/or on the core layer 208. The deposition tool 102 may deposit the frontside adhesion layer 210a and the backside adhesion layer 210b in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the frontside adhesion layer 210a and/or the backside adhesion layer 210b after the deposition tool 102 deposits the frontside adhesion layer 210a and the backside adhesion layer 210b.

FIG. 3B further shows a frontside diffusion barrier layer 212a that may be concurrently formed with the backside diffusion barrier layer 212b. The frontside diffusion barrier layer 212a may be formed over and/or on the frontside adhesion layer 210a, and the backside diffusion barrier layer 212b may be formed under and/or on the backside adhesion layer 210b. The deposition tool 102 may deposit the frontside diffusion barrier layer 212a and/or the backside diffusion barrier layer 212b in an LP-CVD operation. Additionally, or alternatively, the deposition tool 102 may deposit the frontside diffusion barrier layer 212a and/or the backside diffusion barrier layer 212b in an ALD operation, a CVD operation, an epitaxy operation, an oxidation operation, another type of deposition operation described in connection with FIG. 1, and/or another suitable deposition operation. In some implementations, the planarization tool 110 planarizes the frontside diffusion barrier layer 212a and/or the backside diffusion barrier layer 212b after the deposition tool 102 deposits the frontside diffusion barrier layer 212a and/or the backside diffusion barrier layer 212b. In some implementations, the frontside diffusion barrier layer 212a and/or the backside diffusion barrier layer 212b includes a SiN material. In some implementations, the frontside diffusion barrier layer 212a and/or the backside diffusion barrier layer 212b has a thickness that is included in a range of approximately 1800 angstroms (Å) to approximately 2200 Å. However, other materials, thickness values, and thickness ranges for the frontside diffusion barrier layer 212a and/or the backside diffusion barrier layer 212b are within the scope of the present disclosure.

FIG. 3B further shows a frontside chucking layer 214a (sometimes referred to as a dummy chucking layer) that may be concurrently formed with the backside chucking layer 214b. The frontside chucking layer 214a may be formed over and/or on the frontside diffusion barrier layer 212a, and the backside chucking layer 214b may be formed under and/or on the backside diffusion barrier layer 212b. The deposition tool 102 may deposit the frontside chucking layer 214a and/or the backside chucking layer 214b in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the frontside chucking layer 214a and/or the backside chucking layer 214b after the deposition tool 102 deposits the frontside chucking layer 214a and/or the backside chucking layer 214b. In some implementations, the frontside chucking layer 214a and/or the backside chucking layer 214b includes a dielectric material, such as a p(+) type polysilicon material. In some implementations, the frontside chucking layer 214a and/or the backside chucking layer 214b has a thickness (D1) that is included in a range of approximately 400 Å to approximately 480 Å. If the thickness D1 is less than approximately 400 Å, a charging of the backside chucking layer 214b by an ESC may be insufficient to hold a carrier structure (e.g., carrier structure 204) during processing of a semiconductor device (e.g., the semiconductor device 202). If the thickness D1 is greater than approximately 480 Å, manufacturing inefficiencies (e.g., longer processing times) may be introduced. Additionally, or alternatively, the thickness of the backside chucking layer 214b, in combination with a CTE of the backside chucking layer 214b, may be sufficient to introduce stresses and/or strains to damage the semiconductor device being fabricated using the carrier structure. However, other materials, thickness values, and thickness ranges for the frontside chucking layer 214a and/or the backside chucking layer 214b are within the scope of the present disclosure.

Figure 3C:
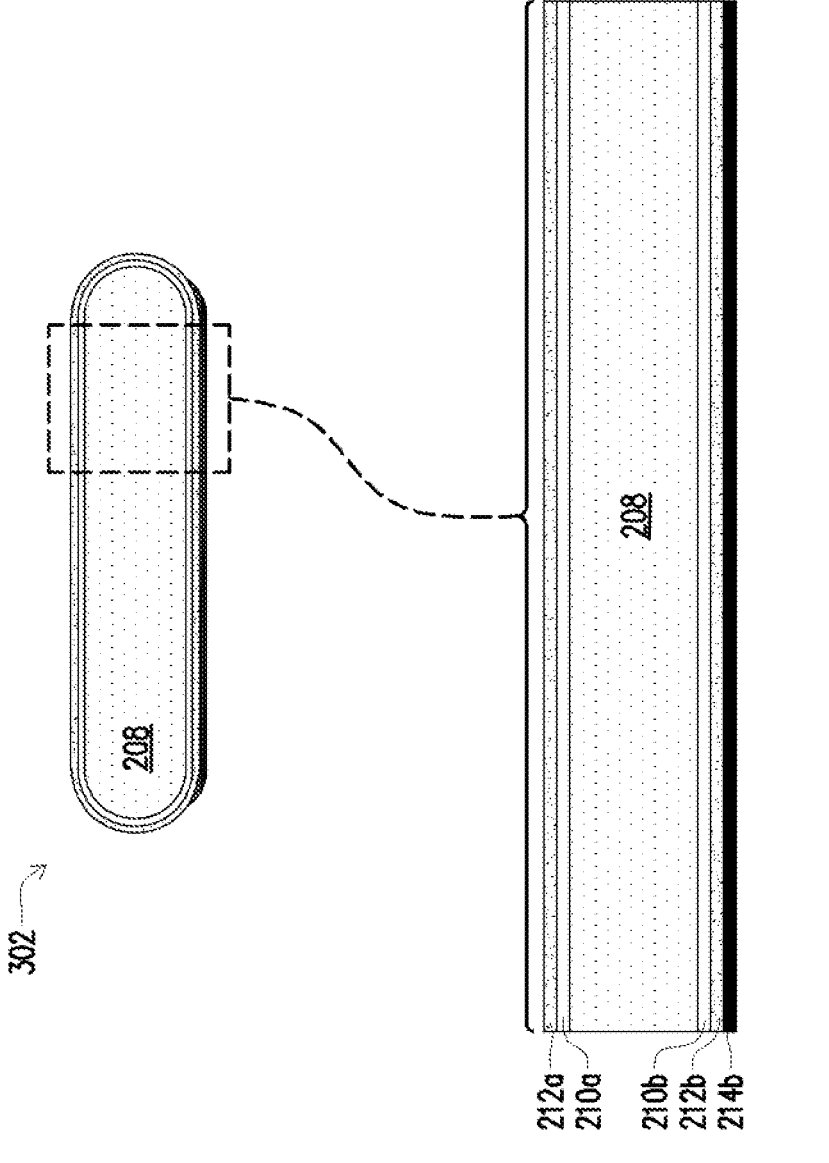

As shown in FIG. 3C, the frontside chucking layer 214a (e.g., the dummy chucking layer) is removed from the frontside diffusion barrier layer 212a. In some implementations, the etch tool 108 performs an etch operation to remove the frontside chucking layer 214a. In some implementations, the etch operation includes a plasma etch operation, a wet chemical etch operation, another type of etch operation described in connection with FIG. 1, and/or another type of etch operation. Additionally, or alternatively and in some implementations, the planarization tool 110 performs a CMP operation, another type of planarization operation described in connection with FIG. 1, and/or another suitable planarization operation to remove the frontside chucking layer 214a.

By removing the frontside chucking layer 214a, a likelihood of thermally-induced stresses and/or strains due to a CTE mismatch between layers in a layer stack (e.g., the frontside adhesion layer 210a, the frontside diffusion barrier layer 212a, and/or the frontside adhesion layer 216a) and other layers of a subsequently formed semiconductor device (e.g., the seed layer 218, the substrate layer 220, and/or layers included in the HEMT structure 222) may be reduced. Such a reduction in thermally-induced stresses and/or strains may reduce a likelihood of damage (e.g., cracking) in the semiconductor device and/or within layers of a carrier structure (e.g., the carrier structure 204) used as part of forming the semiconductor device.

In this way, a yield of a volume of the semiconductor device is increased relative to a yield of a volume of the semiconductor device fabricated using another carrier structure that includes a frontside chucking layer. By increasing the yield, an amount of resources required to fabricate an amount of the semiconductor device (e.g., manufacturing tools, raw materials, manpower, and/or computing resources) may be reduced.

Figure 3D:
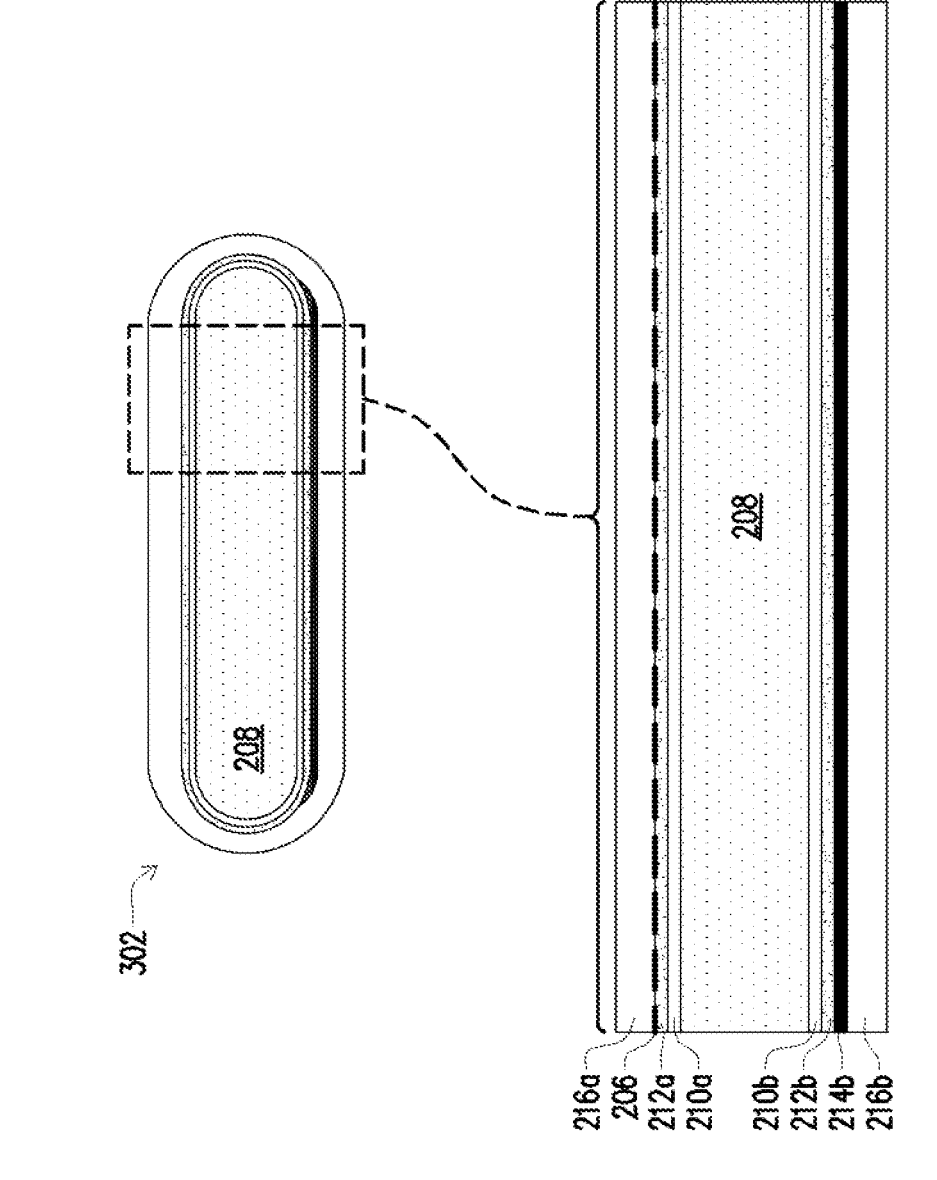

As shown in FIG. 3D, the frontside adhesion layer 216a and the backside adhesion layer 216b may be concurrently formed. The frontside adhesion layer 216a is formed over and/or over the frontside diffusion barrier layer 212a (e.g., without the frontside chucking layer 214a intervening between the frontside diffusion barrier layer 212a and the frontside adhesion layer 216a). The interface region 206 is the interface between the frontside adhesion layer 216a and the frontside diffusion barrier layer 212a. Furthermore, the backside adhesion layer 216b is formed as under and/or on the backside chucking layer 214b.

The deposition tool 102 may deposit the frontside adhesion layer 216a and/or the backside adhesion layer 216b in a PVD operation, an ALD operation, a CVD operation, an epitaxy operation, an oxidation operation, another type of deposition operation described in connection with FIG. 1, and/or another suitable deposition operation. In some implementations, the frontside adhesion layer 216a and/or the backside adhesion layer 216b includes an $SiO_2$ material. Additionally, or alternatively and in some implementations, the frontside adhesion layer 216a and/or the backside adhesion layer 216b include a tetraethyl orthosilicate (TEOS) material. However, other materials for the frontside adhesion layer 216a and/or the backside adhesion layer 216b are within the scope of the present disclosure.

Upon deposition by the deposition tool 102, a thickness of the frontside adhesion layer 216a and/or the backside adhesion layer 216b may be included in a range of approximately 2.7 μm to approximately 3.3 μm. However, other values and ranges for a thickness of the frontside adhesion layer 216a and/or the backside adhesion layer 216b upon deposition are within the scope of the present disclosure.

Figure 3E:
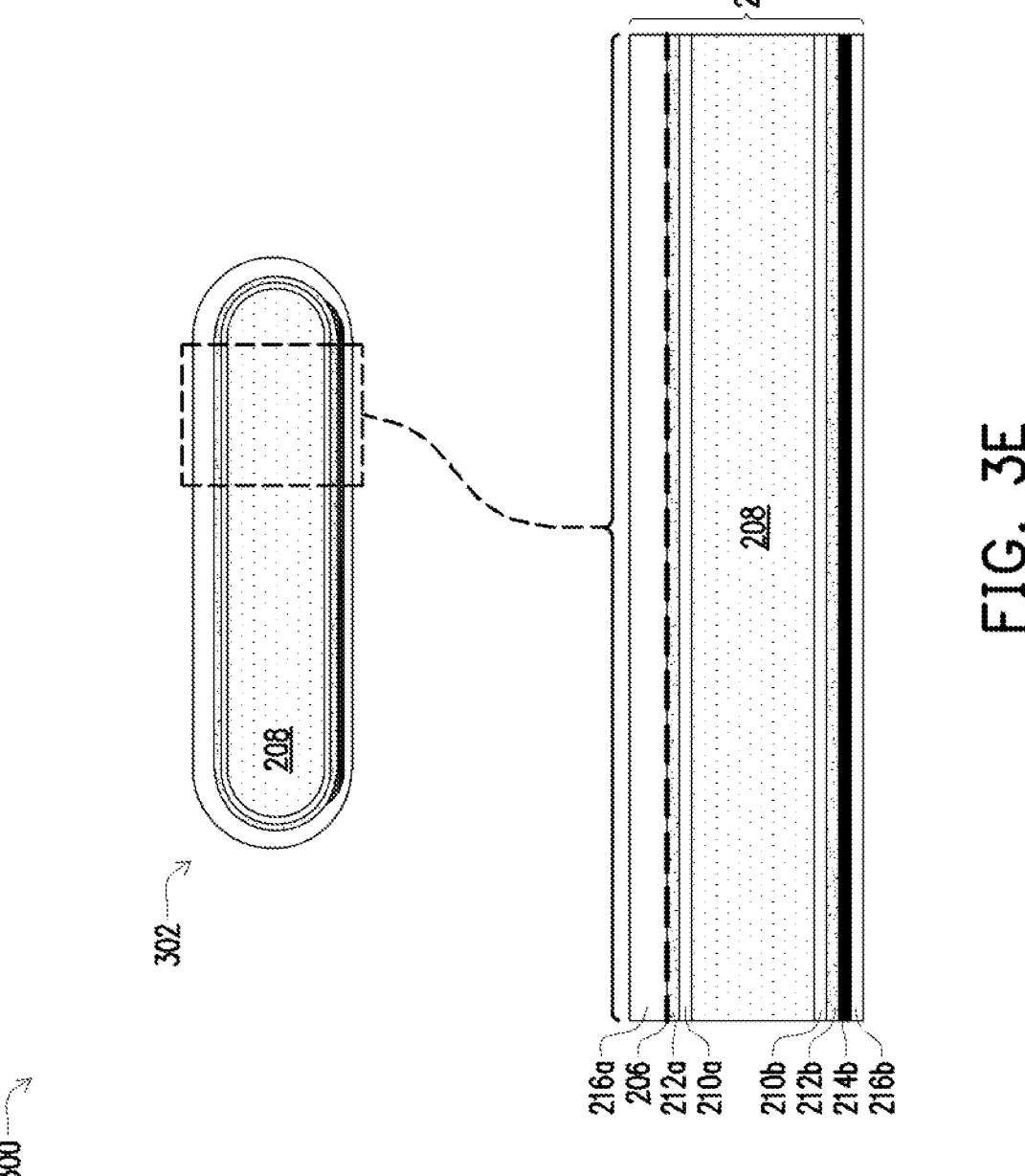

As shown in FIG. 3E, the planarization tool 110 may planarize (e.g., thin down) the frontside adhesion layer 216a and/or the backside adhesion layer 216b as part of forming the carrier structure 204. For example, the planarization tool 110 may perform a CMP operation, another type of planarization operation described in connection with FIG. 1, and/or another suitable planarization operation as part of thinning down the frontside adhesion layer 216a and/or the backside adhesion layer 216b. After thinning, the frontside adhesion layer 216a and/or the backside adhesion layer 216b may have thickness that is included in a range of approximately 1.26 μm to approximately 1.54 μm. However, other values and ranges for the thickness of the frontside adhesion layer 216a and/or the backside adhesion layer 216b (after thinning) are within the scope of the present disclosure.

Figure 3F:
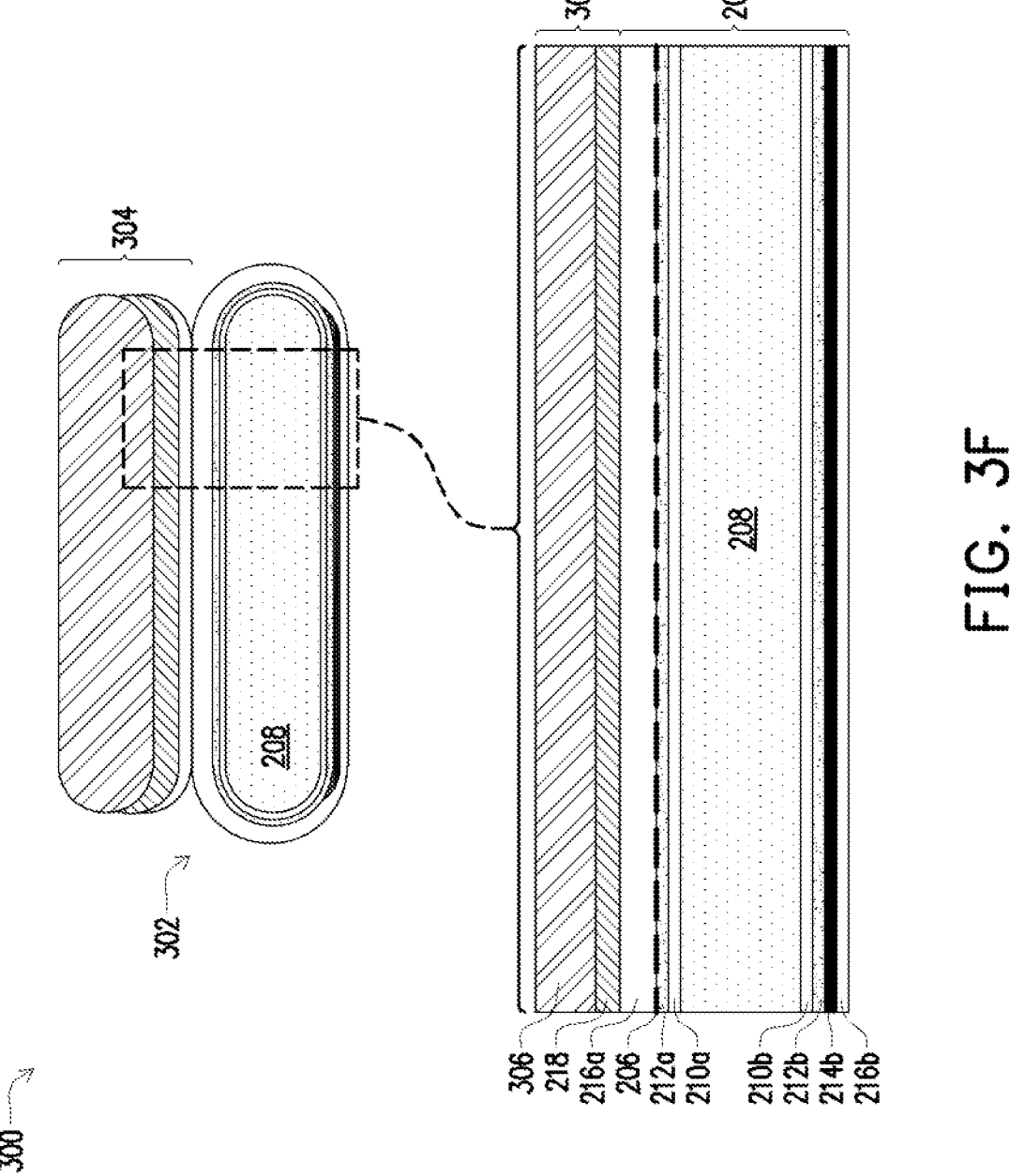

As shown in FIG. 3F, a layer stack 304 (e.g., joined semiconductor substrates or wafers) including the seed layer 218 and a semiconductor layer 306 may be bonded with the frontside adhesion layer 216a. For example, the bonding tool 116 may bond the seed layer 218 and the frontside adhesion layer 216a using a eutectic bonding operation described in connection with FIG. 1, and/or another suitable bonding operation. In some implementations, the seed layer 218 includes a layer of p(−) type of silicon material having a <111> orientation (e.g., Miller index), among other examples. In some implementations, the semiconductor layer 306 includes a layer of a p(+) type of silicon material having a <111> orientation, among other examples. In some implementations, the planarization tool 110 planarizes the semiconductor layer 306 (after the bonding tool bonds the layer stack 304) such that the layer stack 304 includes a thickness that is included in a range of approximately 21 μm to approximately 25 μm. However, other materials, thickness values, and thickness ranges for the layer stack 304 are within the scope of the present disclosure.

Figure 3G:
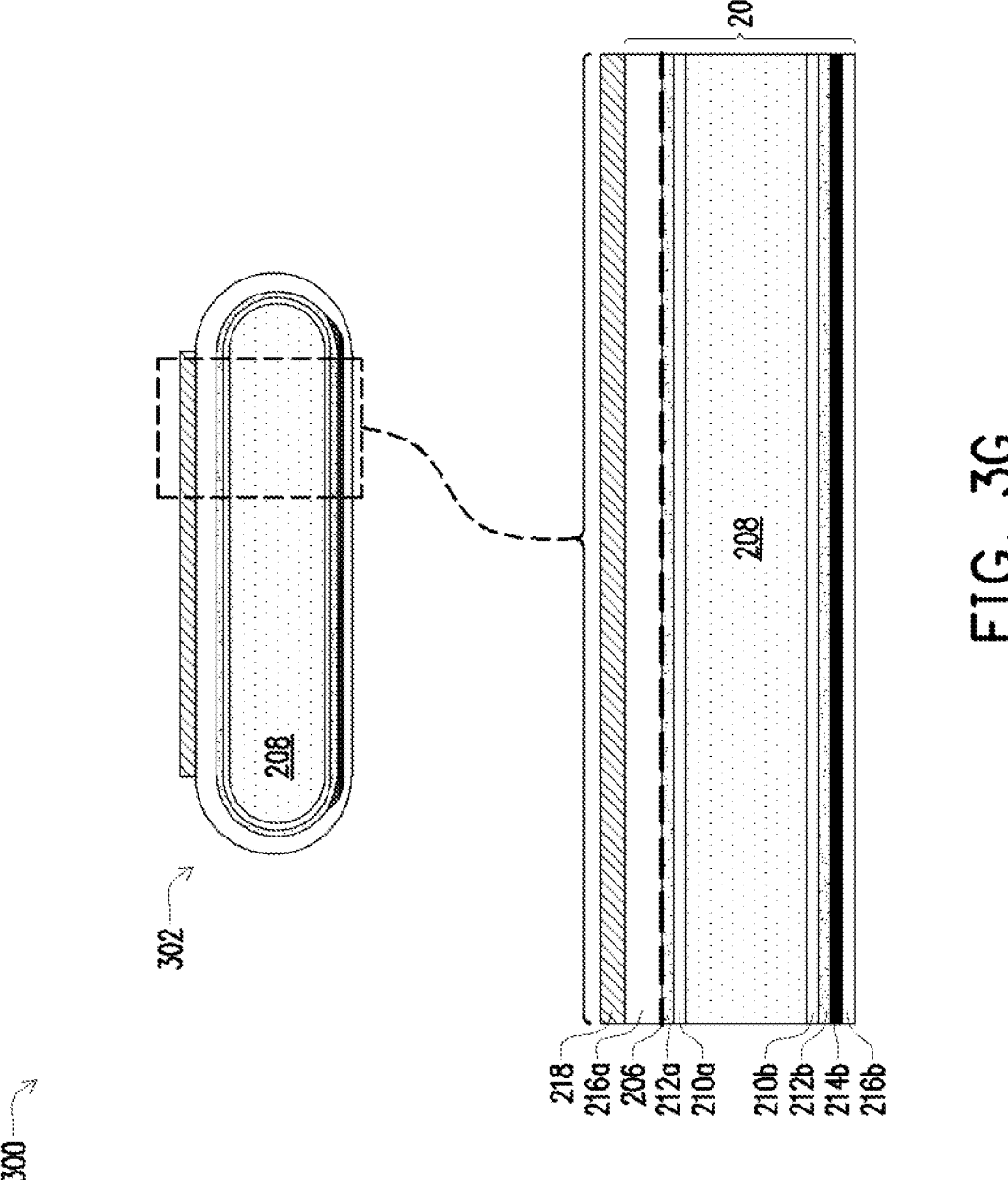

As shown in FIG. 3G, the semiconductor layer 306 is removed from the seed layer 218. In some implementations, removing the semiconductor layer 306 includes the etch tool 108 performing an etch operation (e.g., an "etch-back" process) described in connection with FIG. 1, and/or another suitable etching operation. For example, the etch tool 108 may perform a wet etch operation that removes the semiconductor layer 306 (e.g., portions of the semiconductor layer 306 or all of the semiconductor layer 306) from the seed layer 218 using a hydrofluoric, nitric, acetic (HNA) etchant. Additionally, or alternatively, removing the semiconductor layer 306 from the seed layer 218 may include the planarization tool 110 performing a CMP operation as described in connection with FIG. 1, and/or another suitable planarization operation.

Figure 3H:
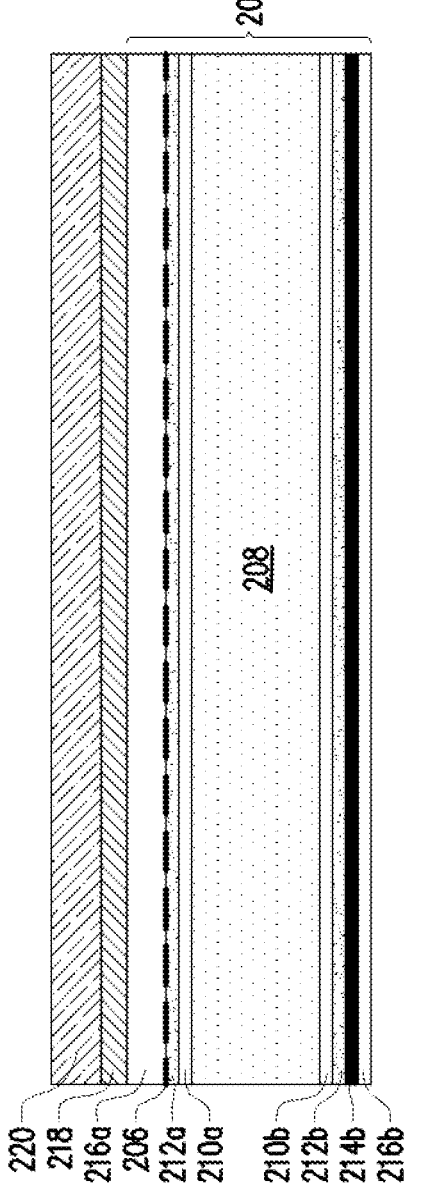

As shown in FIG. 3H, the substrate layer 220 is formed over and/or on the seed layer 218. The deposition tool 102 may deposit the substrate layer 220 in an epitaxy operation. Additionally, or alternatively, the deposition tool 102 may deposit the substrate layer 220 in a PVD operation, an ALD operation, a CVD operation, an oxidation operation, another type of deposition operation described in connection with FIG. 1, and/or another suitable deposition operation. In some implementations, the substrate layer 220 includes a GaN material. In some implementations, the planarization tool 110 planarizes the substrate layer 220 after the deposition tool 102 deposits the substrate layer 220.

Additionally, or alternatively, the substrate layer 220 may include a high bandgap material having a bandgap lattice constant that is in a range of approximately 3.25 eV to approximately 3.75 eV. If the bandgap lattice constant is less than approximately 3.25 eV, the material included in the substrate layer 220 may be incompatible with performance requirements of a semiconductor device (e.g., the semiconductor device 202). If the bandgap lattice constant is greater than approximately 3.75 eV, the material included in the substrate layer 220 may have a CTE that is mismatched with a material of the core layer 208 and may cause defects to the semiconductor device 202 during manufacturing. However, other values and ranges for the bandgap lattice constant for the material of the substrate layer 220 are within the scope of the present disclosure.

As shown in FIG. 3I, the series of operations 300 includes forming the HEMT structure 222 (including the integrated circuitry 224) over and/or on the substrate layer 220. In some implementations, the deposition tool 102 may deposit a combination of dielectric layers and conductive layers in a PVD operation, an ALD operation, a CVD operation, an oxidation operation, another type of deposition operation described in connection with FIG. 1, and/or another suitable deposition operation. Additionally, or alternatively and as part of forming the HEMT structure 222, one or more patterns in photoresist layers may be used to form the HEMT structure 222. In these implementations, the deposition tool 102 forms the photoresist layer on the layers of materials. The exposure tool 104 exposes the photoresist layer to a radiation source to pattern the photoresist layer. The developer tool 106 develops and removes portions of the photoresist layer to expose the patterns. The etch tool 108 etches the layers based on the patterns to form the HEMT structure 222 using a plasma-based operation, a wet chemical etch operation, and/or another type of etch operation. In some implementations, a photoresist removal tool removes the remaining portions of the photoresist layers (e.g., using a chemical stripper, plasma ashing, and/or another technique). In some implementations, a hard mask layers are used as alternative techniques for etching the HEMT structure 222. In some implementations, a photoresist removal tool removes the remaining portions of the photoresist layers (e.g., using a chemical stripper, plasma ashing, and/or another technique).

The HEMT structure 222 may include different types of the integrated circuitry 224. In some implementations, and as an example, the integrated circuitry 224 may be a type of integrated circuitry included in a power semiconductor device (e.g., transformer integrated circuitry, amplifier integrated circuitry, and/or voltage regulation integrated circuitry). In some implementations, and as another example, the integrated circuitry 224 may be a type of integrated circuitry included in an optoelectronic semiconductor device (e.g., photodiode integrated circuitry, LED integrated circuitry, and/or photosensor integrated circuitry).

As shown in FIG. 3J, the semiconductor device 202 is separated from the carrier structure 204. Separating the semiconductor device 202 from the carrier structure 204 (or, alternatively removing the carrier structure 204 from the semiconductor device 202) may include, for example, the laser tool 114 providing energy to a layer included in the carrier structure 204. In some implementations, such a layer may include material having a bandgap lattice constant that, based on a wavelength of an electromagnetic wave (e.g., electromagnetic wave of the energy), causes the layer to absorb the energy to liquify the layer.

As further shown in FIG. 3J, the semiconductor device 202 includes the seed layer 218 and the substrate layer 220 over the seed layer 218. The substrate layer 220 includes a material having a bandgap that is greater than a bandgap of silicon. The semiconductor device 202 includes the HEMT structure 222 structure above the substrate layer 220.

Although FIGS. 3A-3J shows an example series of operations 300 using the carrier structure 204 including the interface region 206 described herein, the series of operations 300 may include fewer operations, different operations, or differently arranged operations than those depicted in FIGS. 3A-3J. Further, one or more of the series of operations 300 using the core using the carrier structure including the interface region 206 may be applicable to a "dual-sided" process performed on the core layer 208 (e.g., the core layer 208 may be in a round, wafer form that is subjected to dual-sided processing). Additionally, one or more of the series of operations 300 may be applicable to a "single-sided" process (e.g., the core layer 208 may be included in a rectangular, die form that is subjected to single-sided processing).

Figure 4:
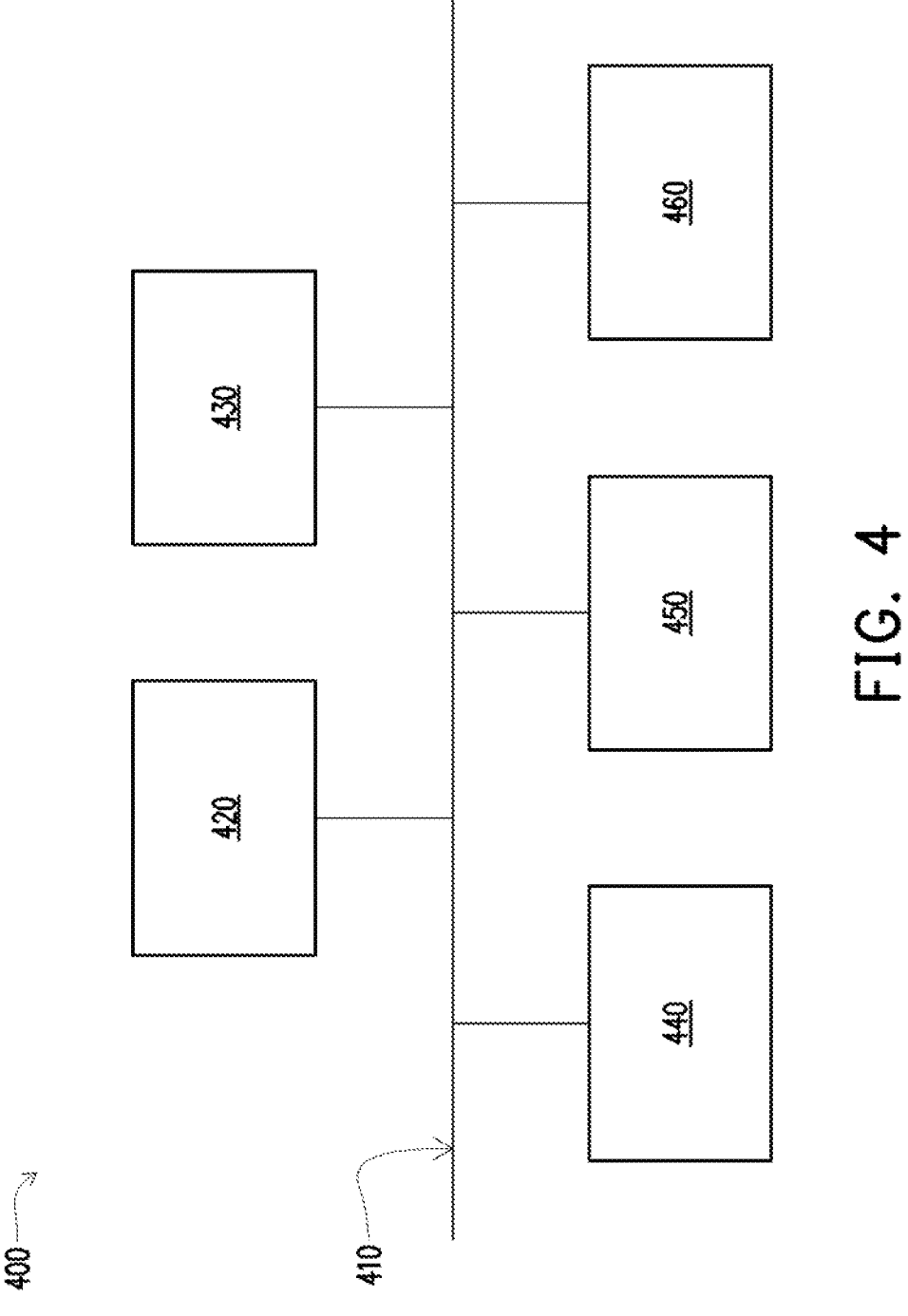
FIG. 4 is a diagram of example components of one or more devices of FIG. 1 described herein.

FIG. 4 is a diagram of example components of a device 400. In some implementations, one or more of the semiconductor processing tools 102-116 and/or the wafer/die transport tool 118 may include one or more devices 400 and/or one or more components of the device 400. As shown in FIG. 4, the device 400 may include a bus 410, a processor 420, a memory 430, an input component 440, an output component 450, and/or a communication component 460.

The bus 410 may include one or more components that enable wired and/or wireless communication among the components of the device 400. The bus 410 may couple together two or more components of FIG. 4, such as via operative coupling, communicative coupling, electronic coupling, and/or electric coupling. For example, the bus 410 may include an electrical connection (e.g., a wire, a trace, and/or a lead) and/or a wireless bus. The processor 420 may include a central processing unit, a graphics processing unit, a microprocessor, a controller, a microcontroller, a digital signal processor, a field-programmable gate array, an application-specific integrated circuit, and/or another type of processing component. The processor 420 may be implemented in hardware, firmware, or a combination of hardware and software. In some implementations, the processor 420 may include one or more processors capable of being programmed to perform one or more operations or processes described elsewhere herein.

The memory 430 may include volatile and/or nonvolatile memory. For example, the memory 430 may include random access memory (RAM), read only memory (ROM), a hard disk drive, and/or another type of memory (e.g., a flash memory, a magnetic memory, and/or an optical memory). The memory 430 may include internal memory (e.g., RAM, ROM, or a hard disk drive) and/or removable memory (e.g., removable via a universal serial bus connection). The memory 430 may be a non-transitory computer-readable medium. The memory 430 may store information, one or more instructions, and/or software (e.g., one or more software applications) related to the operation of the device 400. In some implementations, the memory 430 may include one or more memories that are coupled (e.g., communicatively coupled) to one or more processors (e.g., processor 420), such as via the bus 410. Communicative coupling between a processor 420 and a memory 430 may enable the processor 420 to read and/or process information stored in the memory 430 and/or to store information in the memory 430.

The input component 440 may enable the device 400 to receive input, such as user input and/or sensed input. For example, the input component 440 may include a touch screen, a keyboard, a keypad, a mouse, a button, a microphone, a switch, a sensor, a global positioning system sensor, an accelerometer, a gyroscope, and/or an actuator. The output component 450 may enable the device 400 to provide output, such as via a display, a speaker, and/or a light-emitting diode. The communication component 460 may enable the device 400 to communicate with other devices via a wired connection and/or a wireless connection. For example, the communication component 460 may include a receiver, a transmitter, a transceiver, a modem, a network interface card, and/or an antenna.

The device 400 may perform one or more operations or processes described herein. For example, a non-transitory computer-readable medium (e.g., memory 430) may store a set of instructions (e.g., one or more instructions or code) for execution by the processor 420. The processor 420 may execute the set of instructions to perform one or more operations or processes described herein. In some implementations, execution of the set of instructions, by one or more processors 420, causes one or more processors 420 and/or the device 400 to perform one or more operations or processes described herein. In some implementations, hard-wired circuitry may be used instead of or in combination with the instructions to perform one or more operations or processes described herein. Additionally, or alternatively, the processor 420 may be configured to perform one or more operations or processes described herein. Thus, implementations described herein are not limited to any specific combination of hardware circuitry and software.

The number and arrangement of components shown in FIG. 4 are provided as an example. The device 400 may include additional components, fewer components, different components, or differently arranged components than those shown in FIG. 4. Additionally, or alternatively, a set of components (e.g., one or more components) of the device 400 may perform one or more functions described as being performed by another set of components of the device 400.

FIG. 5 is a flowchart of an example process 500 associated with forming a carrier structure including an interface region. In some implementations, one or more process blocks of FIG. 5 are performed by one or more of semiconductor processing tools (e.g., one or more of the semiconductor processing tools 102-116 and/or the wafer/die transport tool 118). Additionally, or alternatively, one or more process blocks of FIG. 5 may be performed by one or more components of device 400, such as processor 420, memory 430, input component 440, output component 450, and/or communication component 460.

As shown in FIG. 5, process 500 may include forming a frontside diffusion barrier layer and a backside diffusion barrier layer over a core layer (block 510). For example, one or more of the semiconductor processing tools 102-116 and/or the wafer die transport tool 118 may form a frontside diffusion barrier layer (e.g., the frontside diffusion barrier layer 212a) and a backside diffusion barrier layer (e.g., the backside diffusion barrier layer 212b) over a core layer (e.g., the core layer 208) as described above.

As further shown in FIG. 5, process 500 may include forming a frontside chucking layer over the frontside diffusion barrier layer and a backside chucking layer over the backside diffusion barrier layer (block 520). For example, one or more of the semiconductor processing tools 102-116 and/or the wafer/die transport tool 118 may form a frontside chucking layer (e.g., the frontside chucking layer 214a) over the frontside diffusion barrier layer 212a and a backside chucking layer (e.g., the backside chucking layer 214b) over the backside diffusion barrier layer, as described above.

As further shown in FIG. 5, process 500 may include removing the frontside chucking layer (block 530). For example, one or more of the semiconductor processing tools 102-116 may remove the frontside chucking layer 214a, as described above.

As further shown in FIG. 5, process 500 may include forming a frontside adhesion layer over the frontside diffusion barrier layer and a backside adhesion layer over the backside chucking layer (block 540). For example, one or more of the semiconductor processing tools 102-116 and/or the wafer die transport tool 118 may form a frontside adhesion layer (e.g., the frontside adhesion layer 216a) over the frontside diffusion barrier layer 212a and a backside adhesion layer (e.g., the backside adhesion layer 216) over the backside chucking layer, as described above.

As further shown in FIG. 5, process 500 may include joining the frontside adhesion layer and a layer stack that includes a seed layer (block 550). For example, one or more of the semiconductor processing tools 102-116 and/or the wafer/die transport tool may join the frontside adhesion layer a layer stack 3 (e.g., the layer stack 304) that includes a seed layer (e.g., the seed layer 218), as described above.

Process 500 may include additional implementations, such as any single implementation or any combination of implementations described below and/or in connection with one or more other processes described elsewhere herein.

In a first implementation, forming the frontside chucking layer over the frontside diffusion barrier layer and the backside chucking layer over the backside diffusion barrier layer includes forming the frontside chucking layer and the backside chucking layer to each have a thickness that is included in a range of approximately 400 Angstroms to approximately 480 Angstroms.

In a second implementation, alone or in combination with the first implementation, forming the frontside chucking layer over the frontside diffusion barrier layer and the backside chucking layer over the backside diffusion barrier layer includes concurrently forming the frontside chucking layer and the backside chucking layer from a dielectric material.

In a third implementation, alone or in combination with one or more of the first and second implementations, concurrently forming the frontside chucking layer and the backside chucking layer from the dielectric material includes concurrently forming the frontside chucking layer and the backside chucking layer from a p(+) type of poly-silicon material.

In a fourth implementation, alone or in combination with one or more of the first through third implementations, process 500 includes forming a substrate layer (e.g., the substrate layer 220) of a semiconductor device (e.g., the semiconductor device 202) over the seed layer and over the frontside adhesion layer 216a that is formed over the frontside diffusion barrier layer.

In a fifth implementation, alone or in combination with one or more of the first through fourth implementations, forming the substrate layer over the seed layer and over the frontside adhesion layer 2 includes forming the substrate layer through epitaxial growth of a GaN material.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

Figure 6:
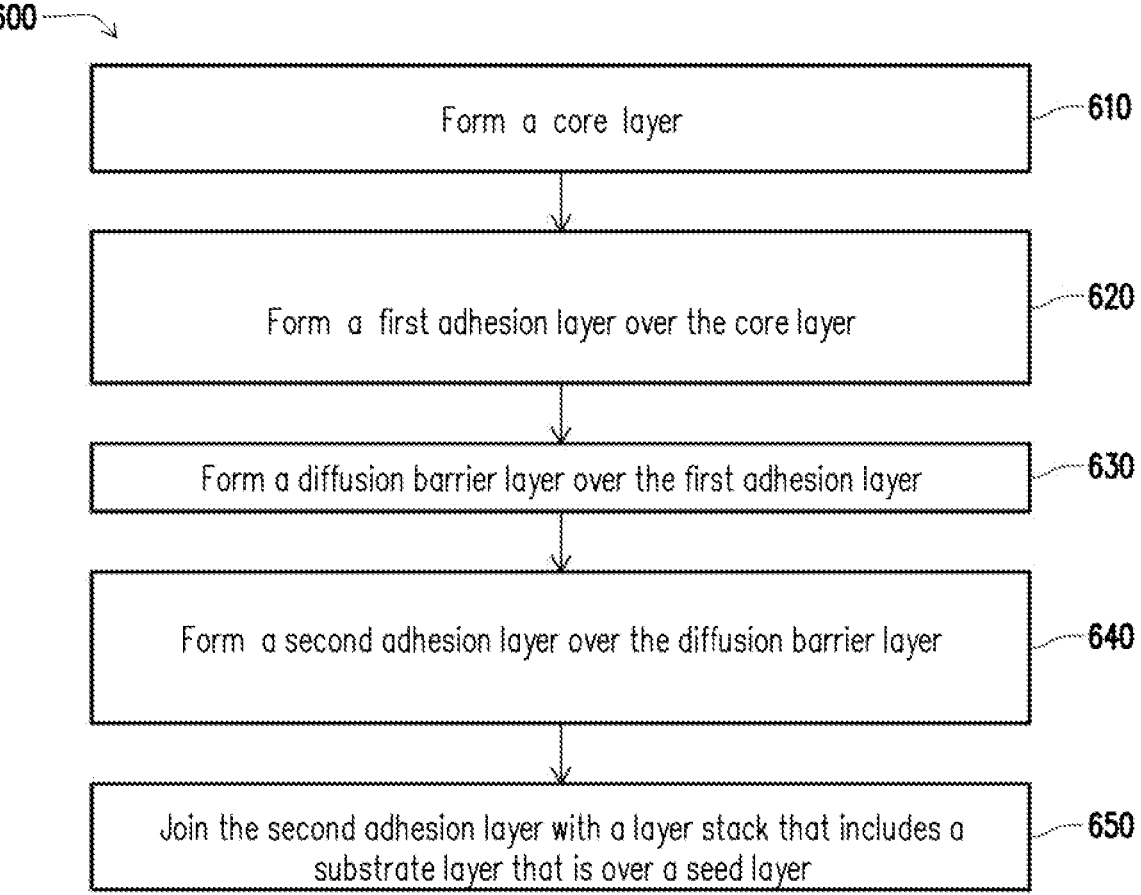

FIG. 6 is a flowchart of an example process 600 associated with forming a carrier structure including an interface region. In some implementations, one or more process region. In some implementations, one or more process blocks of FIG. 6 are performed by one or more of semiconductor processing tools (e.g., one or more of the semiconductor processing tools 102-116, the wafer/die transport tool 118, and/or another tool. Additionally, or alternatively, one or more process blocks of FIG. 6 may be performed by one or more components of device 400, such as processor 420, memory 430, input component 440, output component 450, and/or communication component 460.

As shown in FIG. 6, process 600 may include forming a core layer (block 610). For example, a sintering tool may form a core layer (e.g., the core layer 208). In some implementations, the core layer includes a first material having a first coefficient of thermal expansion for a temperature range related to a growth of an epitaxial material.

As further shown in FIG. 6, process 600 may include forming a first adhesion layer over the core layer (block 620). For example, one or more of the semiconductor processing tools 102-116 may form a first adhesion layer (e.g., the frontside adhesion layer 210a) over the core layer.

As further shown in FIG. 6, process 600 may include forming a diffusion barrier layer over the first adhesion layer (block 630). For example, one or more of the semiconductor processing tools 102-116 may form a diffusion barrier layer (e.g., the frontside diffusion barrier layer 212a) over the first adhesion layer.

As further shown in FIG. 6, process 600 may include forming a second adhesion layer over the diffusion barrier layer (block 640). For example, one or more of the semiconductor processing tools 102-116 may form a second adhesion layer (e.g., the frontside adhesion layer 216a) over the core layer.

As further shown in FIG. 6, process 600 may include joining the second adhesion layer with a layer stack that includes a substrate layer that is over a seed layer (block 650). For example, one or more of the one or more of the semiconductor processing tools 102-116 may join the second adhesion layer with a layer stack (e.g., the layer stack 304) that includes a substrate layer (e.g., the substrate layer 220) that is over the seed layer (e.g., the seed layer 218).

In some implementations, the substrate layer includes a second material having a second coefficient thermal of expansion for the temperature range related to the growth of the epitaxial material, where a ratio of the second coefficient of thermal expansion to the first coefficient of thermal expansion is approximately 1:1. In some implementations, joining the second adhesion layer with the layer stack includes joining the seed layer with the with the second adhesion layer above the diffusion barrier layer Process 600 may include additional implementations, such as any single implementation or any combination of implementations described below and/or in connection with one or more other processes described elsewhere herein.

In a first implementation, the first material and the second material are a same material.

In a second implementation, alone or in combination with the first implementation, the first material and the second material are different metal nitride materials.

In a third implementation, alone or in combination with one or more of the first and second implementations, the first material comprises an aluminum nitride material.

In a fourth implementation, alone or in combination with one or more of the first through third implementations, the second material comprises a gallium nitride material.

In a fifth implementation, alone or in combination with one or more of the first through fourth implementations, the substrate layer is above an interface region (e.g., the interface region 206) between the diffusion barrier layer and the second adhesion layer.

In a sixth implementation, alone or in combination with one or more of the first through fifth implementations, the first coefficient of thermal expansion is included in a range of 5.5 microns per meter Kelvin to 6.5 microns per meter Kelvin.

In a seventh implementation, alone or in combination with one or more of the first through sixth implementations, the seed layer comprises a p(−) type of silicon material.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

FIG. 7 is a flowchart of an example process 700 associated with forming a carrier structure including an interface region. In some implementations, one or more process blocks of FIG. 6 are performed by one or more of semiconductor processing tools (e.g., one or more of the semiconductor processing tools 102-116 and/or the wafer/die transport tool 118). Additionally, or alternatively, one or more process blocks of FIG. 6 may be performed by one or more components of device 400, such as processor 420, memory 430, input component 440, output component 450, and/or communication component 460.

As shown in FIG. 7, process 700 may include forming a carrier structure including a core layer that joins with a first adhesion layer that joins with a diffusion barrier layer that joins with a second adhesion layer (block 710). For example, one or more of the semiconductor processing tools 102-116 may form a carrier structure 204 including a core layer (e.g., the core layer 208) that joins with a first adhesion layer (e.g., the frontside adhesion layer 210a) that joins with a diffusion barrier layer (e.g., the frontside diffusion barrier layer 212a) that joins with a second adhesion layer (e.g., the frontside adhesion layer 216a), as described above. In some implementations, the second adhesion layer is over the over the diffusion barrier layer, the diffusion barrier layer is over the first adhesion layer, and the first adhesion layer is over the core layer.

As further shown in FIG. 7, process 700 may include forming a semiconductor device, including a substrate layer that includes a high bandgap material, over the second adhesion layer (block 720). For example, one or more of the semiconductor processing tools 102-116 and/or the wafer die transport tool 118 may form a semiconductor device 202, including a substrate layer 220 that includes a material having a bandgap greater than a threshold, over the second adhesion layer (e.g., the frontside adhesion layer 216a), as described above. In some implementations, the substrate layer that includes the material having the bandgap greater than the threshold is over a seed layer of the semiconductor device. In some implementations, the seed layer 218 is over the second adhesion layer.

As further shown in FIG. 7, process 700 may include removing the carrier structure from the semiconductor device (block 730). For example, one or more of the semiconductor processing tools 102-116 may remove the carrier structure 204 from the semiconductor device 202, as described above.

Process 700 may include additional implementations, such as any single implementation or any combination of implementations described below and/or in connection with one or more other processes described elsewhere herein.

In a first implementation, forming the carrier structure 204 includes forming the carrier structure 204 to include an interface region (e.g., the interface region 206) between the diffusion barrier layer (e.g., the frontside diffusion barrier layer 212a) and the second adhesion layer (e.g., the frontside adhesion layer 216a), where the interface region excludes an intervening chucking layer (e.g., excludes the frontside chucking layer 214a).

In a second implementation, alone or in combination with the first implementation, the seed layer that joins directly with the second adhesion layer includes a p(−) type of silicon material.

In a third implementation, alone or in combination with one or more of the first and second implementations, forming the semiconductor device over the second adhesion layer includes forming an optoelectronic type of semiconductor device above the diffusion barrier layer that joins with the second adhesion layer.

In a fourth implementation, alone or in combination with one or more of the first through third implementations, forming the semiconductor device over the second adhesion layer includes forming a power type of semiconductor device above the diffusion barrier layer that joins with the second adhesion layer.

In a fifth implementation, alone or in combination with one or more of the first through fourth implementations, the material having the bandgap greater than the threshold includes a material having a bandgap that is greater than a threshold of 2.0 eV.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations herein describe a carrier structure and techniques of forming a semiconductor device using the carrier structure. The carrier structure includes a core layer formed from a layer of a high bandgap material, a backside layer stack formed on a backside surface of the layer of the high bandgap material, and a frontside layer stack formed on a frontside surface of the layer of the high bandgap material. The backside layer stack includes a backside chucking layer (e.g., a layer of a polysilicon material) that intervenes between a backside diffusion barrier layer and a backside adhesion layer. The frontside layer stack includes a corresponding frontside diffusion barrier layer that interfaces with a corresponding frontside adhesion layer. A corresponding frontside chucking layer has been eliminated. By eliminating the frontside chucking layer, a likelihood of thermally-induced stresses and/or strains due to a CTE mismatch between layers of the frontside layer stack and other layers of the semiconductor device, during formation of the semiconductor device, is reduced.

In this way, a yield of a volume of the semiconductor device fabricated using the carrier structure is increased relative to a yield of a volume of the semiconductor device fabricated using another carrier structure that includes the frontside chucking layer. By increasing the yield, an amount of resources required to fabricate an amount of the semiconductor device (e.g., manufacturing tools, raw materials, manpower, and/or computing resources) may be reduced.

As described in greater detail above, some implementations described herein provide a method. The method includes forming a frontside diffusion barrier layer and a backside diffusion barrier layer over a core layer. The method includes forming a frontside chucking layer over the frontside diffusion barrier layer and a backside chucking layer over the backside diffusion barrier layer. The method includes removing the frontside chucking layer. The method includes forming a frontside adhesion layer over the frontside diffusion barrier layer and a backside adhesion layer over the backside chucking layer. The method includes joining the frontside adhesion layer and a layer stack that includes a seed layer.

As described in greater detail above, some implementations described herein provide a method. The method includes forming a carrier structure including a core layer that joins with a first adhesion layer that joins with a diffusion barrier layer that joins with a second adhesion layer. In some implementations, the second adhesion layer is over the over the diffusion barrier layer, the diffusion barrier layer is over the first adhesion layer, and the first adhesion layer is over the core layer. The method includes forming a semiconductor device, including a substrate layer that includes a material having a bandgap greater than a threshold, over the second adhesion layer, where the substrate layer that includes the material having the bandgap greater than the threshold is over a seed layer of the semiconductor device, and where the seed layer is over the second adhesion layer. The method includes removing the carrier structure from the semiconductor device.

As described in greater detail above, some implementations described herein provide a method. The method includes forming core layer, where the core layer includes a first material having a first coefficient of thermal expansion for a temperature range related to a growth of an epitaxial material. The method includes forming a first adhesion layer over the core layer, forming a diffusion barrier layer over the first adhesion layer, and forming a second adhesion layer over the diffusion barrier layer. The method includes joining the second adhesion layer with a layer stack that includes a substrate layer that is over a seed layer. In some implementations, the substrate layer includes a second material having a second coefficient thermal of expansion for the temperature range related to the growth of the epitaxial material, where a ratio of the second coefficient of thermal expansion to the first coefficient of thermal expansion is approximately 1:1. In some implementations, joining the second adhesion layer with the layer stack includes joining the seed layer with the with the second adhesion layer above the diffusion barrier layer.

As described in greater detail above, some implementations described herein provide a method. The method includes forming a carrier structure including a core layer that joins with a first adhesion layer that joins with a diffusion barrier layer that joins with a second adhesion layer. The method includes forming a semiconductor device, including a substrate layer that includes a high bandgap material, on the second adhesion layer, where the substrate layer that includes the high bandgap material is over a seed layer of the semiconductor device, and where the seed layer is over the second adhesion layer. The method includes removing the temporary carrier structure from the semiconductor device.

As described in greater detail above, some implementations herein provide a semiconductor device. The semiconductor device includes a seed layer and substrate layer over the seed layer. The substrate layer includes a material having a bandgap that is greater than a bandgap of silicon. The semiconductor device includes a high electron mobility transistor structure above the substrate layer.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a frontside diffusion barrier layer and a backside diffusion barrier layer over a core layer;

forming a frontside chucking layer over the frontside diffusion barrier layer and a backside chucking layer over the backside diffusion barrier layer;

removing the frontside chucking layer;

forming a frontside adhesion layer over the frontside diffusion barrier layer and a backside adhesion layer over the backside chucking layer; and joining the frontside adhesion layer and a layer stack that includes a seed layer.

2. The method of claim 1, wherein forming the frontside chucking layer over the frontside diffusion barrier layer and the backside chucking layer over the backside diffusion barrier layer comprises:

forming the frontside chucking layer and the backside chucking layer to each have a thickness that is included in a range of 400 Angstroms to 480 Angstroms.

3. The method of claim 1, wherein forming the frontside chucking layer over the frontside diffusion barrier layer and the backside chucking layer over the backside diffusion barrier layer comprises:

concurrently forming the frontside chucking layer and the backside chucking layer from a dielectric material.

4. The method of claim 3, wherein concurrently forming the frontside chucking layer and the backside chucking layer from the dielectric material comprises:

concurrently forming the frontside chucking layer and the backside chucking layer from a p(+) type of polysilicon material.

5. The method of claim 1, further comprising:

forming a substrate layer of a semiconductor device over the seed layer and over the frontside adhesion layer that is formed over the frontside diffusion barrier layer.

6. The method of claim 5, wherein forming the substrate layer over the seed layer and over the frontside adhesion layer that is formed over the frontside diffusion barrier layer comprises:

forming the substrate layer through epitaxial growth of a material.

7. A method, comprising:

forming a core layer, wherein the core layer comprises a first material having a first coefficient of thermal expansion for a temperature range related to a growth of an epitaxial material;

forming a first adhesion layer over the core layer;

forming a diffusion barrier layer over the first adhesion layer;

forming a chucking layer over the diffusion barrier layer;

removing the chucking layer;

forming a second adhesion layer over the diffusion barrier layer; and joining the second adhesion layer with a layer stack that includes a substrate layer that is over a seed layer, wherein the substrate layer includes a second material having a second coefficient of thermal expansion for the temperature range related to the growth of the epitaxial material, wherein a ratio of the second coefficient of thermal expansion to the first coefficient of thermal expansion is approximately 1:1, and wherein joining the second adhesion layer with the layer stack includes joining the seed layer with the second adhesion layer above the diffusion barrier layer.

8. The method of claim 7, wherein the first material and the second material are a same material.

9. The method of claim 7, wherein the first material and the second material are different metal nitride materials.

10. The method of claim 7, wherein the first material comprises:

an aluminum nitride material.

11. The method of claim 7, wherein the second material comprises:

a gallium nitride material.

12. The method of claim 7, wherein the substrate layer is above an interface region between the diffusion barrier layer and the second adhesion layer.

13. The method of claim 7, wherein the first coefficient of thermal expansion is included in a range of 5.5 microns per meter Kelvin to 6.5 microns per meter Kelvin.

14. The method of claim 7, wherein the seed layer comprises:

a p(−) type of silicon material.

15. A method comprising:

forming a first dielectric layer over a core layer;

forming a second dielectric layer over the first dielectric layer, wherein the second dielectric layer comprises a different dielectric material from the first dielectric layer;

forming a chucking layer over the second dielectric layer;

removing the chucking layer;

forming a third dielectric layer over the second dielectric layer, wherein the third dielectric layer comprises a same dielectric material as the first dielectric layer; and bonding the third dielectric layer with a layer stack that includes a substrate layer that is over a seed layer, wherein the substrate layer includes a material having a coefficient thermal of expansion approximately equal to a coefficient thermal of expansion of the core layer.

16. The method of claim 15, wherein bonding the third dielectric layer with a layer stack includes bonding the seed layer with the third dielectric layer.

17. The method of claim 15, wherein the seed layer comprises:

a p(−) type of silicon material.

18. The method of claim 15, wherein the core layer comprises aluminum nitride.

19. The method of claim 15, wherein the substrate layer comprises gallium nitride.

20. The method of claim 15, further comprising forming a high electron mobility transistor structure above the substrate layer.

*   *   *   *   *